US 6,735,098 B2

(12) United States Patent
Hussein et al.

(10) Patent No.: US 6,735,098 B2
(45) Date of Patent: May 11, 2004

(54) INRUSH CURRENT LIMITING CIRCUIT, POWER SOURCE DEVICE AND POWER CONVERSION DEVICE

(75) Inventors: Khalid Hassan Hussein, Fukuoka (JP); Kazuaki Hiyama, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/169,727

(22) PCT Filed: Nov. 30, 2000

(86) PCT No.: PCT/JP00/08492

§ 371 (c)(1),
(2), (4) Date: Jul. 15, 2002

(87) PCT Pub. No.: WO02/45232

PCT Pub. Date: Jun. 6, 2002

(65) Prior Publication Data

US 2002/0191426 A1 Dec. 19, 2002

(51) Int. Cl.$^7$ .................. H02H 7/125; G05F 5/00
(52) U.S. Cl. ............. 363/56.3; 323/299; 323/908; 361/58; 361/111
(58) Field of Search .............. 363/56.1, 56.3, 363/56.8, 56.9, 40, 51, 50, 49, 56.01, 56.02, 56.03, 31, 35, 125; 323/299, 901, 908, 298, 273, 277; 361/18, 58, 111, 113

(56) References Cited

U.S. PATENT DOCUMENTS 5,374,887 A * 12/1994 Drobnik ............... 323/299
6,353,545 B1 * 3/2002 Ueda .................. 363/40

FOREIGN PATENT DOCUMENTS

| EP | 0 569 883 | 11/1993 |
|----|-----------|---------|
| EP | 0 653 841 | 5/1995 |
| JP | 02 013273 | 1/1990 |
| JP | 7-59358 | 3/1995 |
| JP | 08 289546 | 11/1996 |

* cited by examiner

Primary Examiner—Rajnikant B Patel
(74) Attorney, Agent, or Firm—Oblon, Spivak, McClelland, Maier & Neustadt, P.C.

(57) ABSTRACT

An inrush current limiting circuit, a power source device, and a power conversion device. The circuit and devices limit an inrush current with high reliability and durability while reducing overall weight and volume of the device even under a high rated power. A switch, a capacitor, and a switching element are connected in series to one another, and the serial circuit formed thereof is connected to the main power source. An inverter is connected to the capacitor. A serial circuit formed of a capacitor and a resistor is connected between a collector and a gate of the switching element. A drive circuit drives a switching element to turn ON when the switch turns ON.

15 Claims, 15 Drawing Sheets

FIG. 8
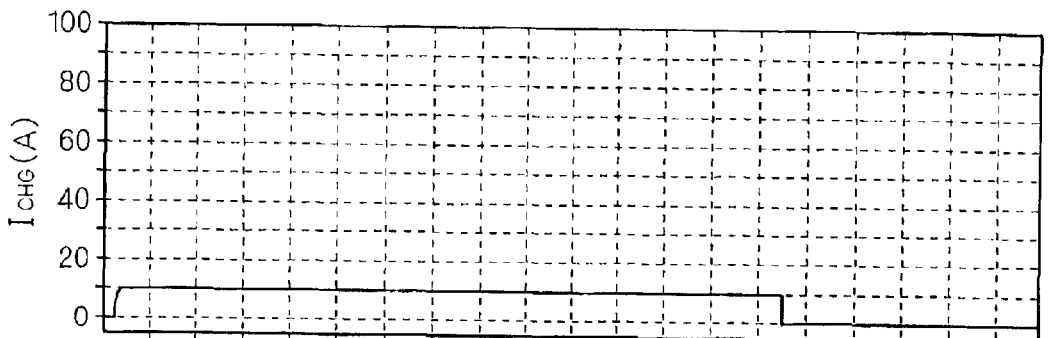
(A)
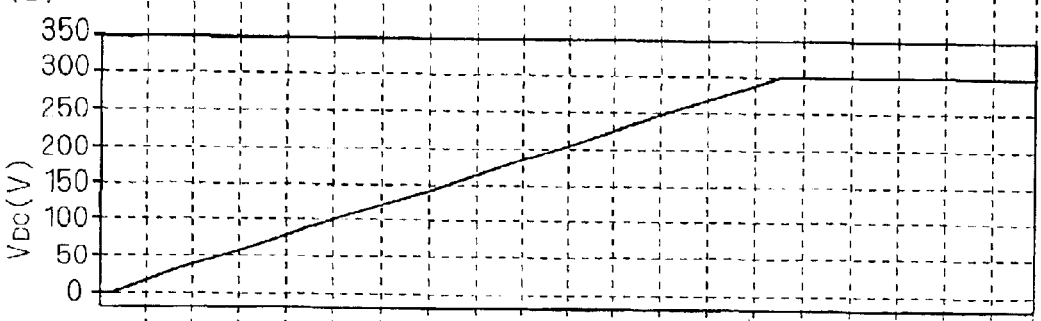
(B)
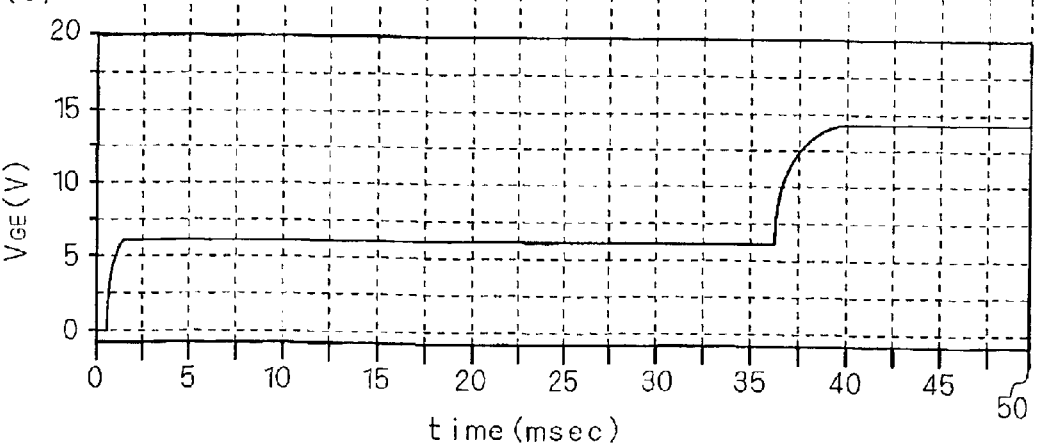
(C)

F I G . 1 3
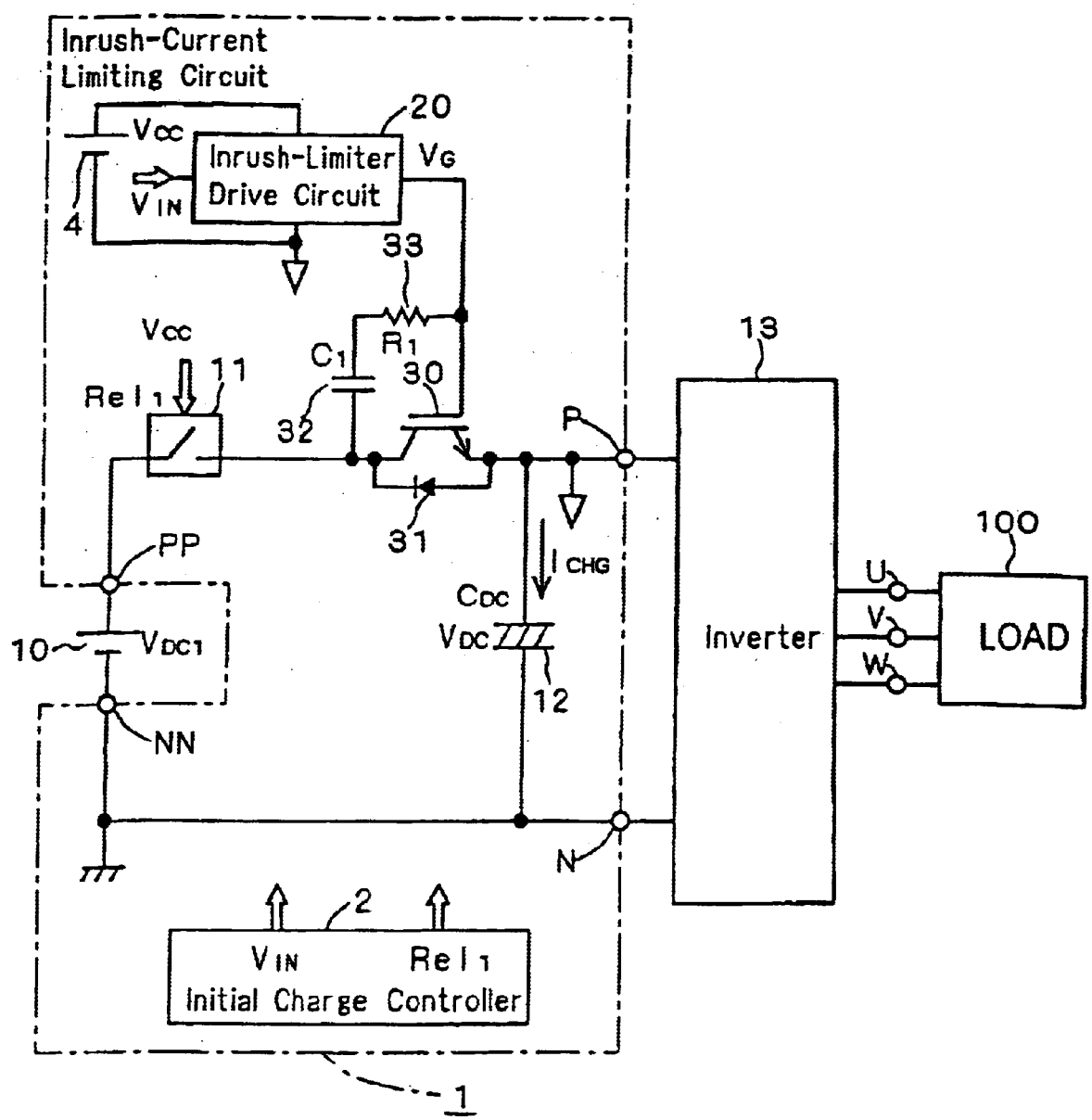

INRUSH CURRENT LIMITING CIRCUIT, POWER SOURCE DEVICE AND POWER CONVERSION DEVICE

TECHNICAL FIELD

The present invention relates to an inrush current limiting circuit, a power source device and a power conversion device; in particular, relates to an improvement thereof to limit an inrush current with high reliability and durability while reducing the overall weight and volume of the device even under a high rated power.

BACKGROUND ART

FIG. 16 is a circuit diagram showing a structure of a conventional power conversion device (which will be hereinafter referred to as "first prior art") having an inrush current limiting circuit. This power conversion device 451 comprises a main power source 10, an inrush current limiting circuit 301 and an inverter 13. The main power source 10 is connected to input terminals PP and NN of the inrush current limiting circuit 301, and the inverter 13 is connected to the output terminals P and N. The power conversion device 451 is utilized by connecting a three-phase load 100, such as a motor, to output terminals U, V and W of the inverter 13.

The inrush current limiting circuit 301 comprises switches 11 and 11a, a resistor 11b, and a capacitor 12. The main power source 10 supplies the input terminals PP and NN with a DC (i.e. direct current) source voltage $V_{DC1}$. The capacitor 12 so functions as to hold the source voltage $V_{DC1}$ at a constant level by means of its capacitance $C_{DC}$. The switch 11, structured as a relay, functions as a main switch that turns ON when starting the inverter 13 and turns OFF when stopping it.

The switch 11a and the resistor 11b are interposed between the main power source 10 and the capacitor 12 so as to limit an inrush current which flows to charge the capacitor 12 immediately after the switch 11 turns on. After the switch 11 turns ON to start the inverter 13, the switch 11a remains OFF until charging of the capacitor 12 is almost completed. Accordingly, the inrush current is limited by the resistor 11b.

When the charged voltage across the capacitor 12 almost reaches the source voltage $V_{DC1}$, the switch 11a turns on. Thereafter, the inverter 13 starts its normal operation. Thus, a DC current is supplied to the inverter 13 by the main power source 10 with little loss, during the normal operation of the inverter 13.

However, since a large current supplied by the main power source 10 flows through the switch 11a and the resistor 11b, the switch 11a and the resistor 11b are required to have a high rated power, as well as the switch 11 as the main switch. In the power conversion device 451, therefore, it has been a problem that overall weight and volume of the device are large and a manufacturing cost thereof is high.

Further, since the switch 11 and the switch 11a (in particular, the switch 11) have to operate mechanically while a high voltage being applied, the reliability and durability thereof have been problematic. In particular, arcing is influential to the reliability and durability. Moreover, conduction losses of both the switch 11 and the switch 11a during the normal operation of the inverter 13 have also been not negligible concerns.

FIG. 17 is a circuit diagram showing a structure of another conventional power conversion device (which will be hereinafter referred to as "second prior art") having an inrush current limiting circuit. This power conversion device 452 is disclosed in Japanese Patent Application Laid-Open No. 8-289546 (1996), and is characteristically different from the power conversion devices 451 in that a transistor 30a and a base drive circuit lid are used for an inrush current limiting circuit 302 in place of the switch 11a.

Even though the power conversion device 452 eliminates the problem arising from the switch 11a, it still needs the resistor 11b which must have a high rated power. Therefore, the power conversion device 452 has also been disadvantageous in that the weight and volume of the device are large and the manufacturing cost thereof is high. Further, the switch 11 has to operate mechanically while a high voltage being applied similarly to that of the power conversion device 451, and therefore, the reliability and durability of the switch 11 has been problematic.

FIG. 18 is a circuit diagram showing a structure of still another conventional power conversion device (which will be hereinafter referred to as "third prior art") having an inrush current limiting circuit. This power conversion device 453 is characteristically different from the power conversion device 451 according to the first prior art in that an NTC (negative coefficient thermistor) 11c is used for an inrush current limiting circuit 303 in place of the switch 11a and the resistor 11b.

Usually when starting the inverter 13, since the NTC 11c is low in temperature, it has high resistance. The inrush current flowing after the switch 11 turns ON, therefore, is limited by a high resistance of the NTC 11c. The temperature of the NTC 11c rapidly rises up due to loss heat generated in the NTC 11c. Accordingly, the resistance of the NTC 1c rapidly decreases, which decreases loss in the NTC 11c.

The loss generated in the NTC 11c during the operation of the inverter 13, however, is not negligible, and therefore, the power conversion device 453 has been disadvantageously applicable only to devices having a low rated power (e.g. few kW or less). Further, if the inverter 13 starts operation before the NTC 11c has sufficiently been cooled down, e.g. the inverter 5 restarts immediately after it has stopped, the NTC 11c does not sufficiently function as an inrush current limiter, which has also degraded the reliability of the device.

DISCLOSURE OF INVENTION

Accordingly, it is an object of the present invention to obtain an inrush current limiting circuit which eliminates the above mentioned problems and limits an inrush current with high reliability and durability while reducing overall weight and volume of the device even under a high rated power, and to provide a power source device and a power conversion device having the inrush current limiting circuit.

In order to achieve the object, a first aspect of the present invention is directed to an inrush current limiting circuit. The inrush current limiting circuit comprises: a first capacitor; a first switching element of a charge driven type, one main electrode thereof being connected to one end of the capacitor; and a second capacitor, one end thereof being connected to the one main electrode of the first switching element, and other end thereof being connected to a control electrode of the switching element.

According to a second aspect of the present invention, in the initial current limiting circuit of the first aspect, the inrush current limiting circuit further comprises: a first resistor interposed between the one main electrode and the control electrode of the first switching element and connected in series to the second capacitor.

According to a third aspect of the present invention, in the initial current limiting circuit of the first aspect, the inrush current limiting circuit further comprises: a first diode connected in inverse-parallel to the first switching element.

According to a fourth aspect of the present invention, in the initial current limiting circuit of the first aspect, the inrush current limiting circuit further comprises: a drive circuit connected to the control electrode of the first switching element, and driving the first switching elements in response to a control signal.

According to a fifth aspect of the present invention, in the initial current limiting circuit of the fourth aspect, the drive circuit comprises a first output resistor interposed into a path of a drive current which drives the first switching element to turn ON.

According to a sixth aspect of the present invention, in the initial current limiting circuit of the fourth aspect, the drive circuit comprises: a second switching element, one main electrode thereof being connected to a source line; a first output resistor, one end thereof being connected to the other main electrode of the second switching element, and other end thereof being connected to the control electrode of the first switching element; and a third switching element, one main electrode thereof being connected to the control electrode of the first switching element, the other main electrode thereof being connected to the other main electrode of said first switching element, and a control electrode thereof being connected to a control electrode of the second switching element.

According to a seventh aspect of the present invention, in the initial current limiting circuit of the sixth aspect, the drive circuit further comprises a second output resistor interposed between the control electrode of the first switching element and the one main electrode of the third switching element.

According to an eighth aspect of the present invention, in the initial current limiting circuit of the fourth aspect, the drive circuit comprises: a second switching element, one main electrode thereof being connected to a source line; a third switching element, one main electrode thereof being connected to other main electrode of the second switching element, other main electrode thereof being connected to other main electrode of the first switching element, and a control electrode thereof being connected to a control electrode of the second switching element; a first output resistor, one end thereof being connected to a connection between the second switching element and the third switching element, and other end thereof being connected to the control electrode of the first switching element; and a second diode connected in parallel to the first output resistor so that a forward current thereof drives the first switching element to turn OFF.

According to a ninth aspect of the present invention, in the initial current limiting circuit of the fourth aspect, the drive circuit comprises: a second resistor, one end thereof being connected to a source line; a first output resistor, one end thereof being connected to other end of the second resistor, other end thereof being connected to the control electrode of the first switching element; a third switching element, one main electrode thereof being connected to the other end of the second resistor, other main electrode thereof being connected to other main electrode of the first switching element; and a second diode connected in parallel to the first output resistor so that a forward current thereof drives the first switching element to turn OFF.

According to a tenth aspect of the present invention, in the initial current limiting circuit of the first aspect, the inrush current limiting circuit further comprises: a switch connected in series to the first capacitor and the first switching element.

According to an eleventh aspect of the present invention, in the initial current limiting circuit of the tenth aspect, the inrush current limiting circuit further comprises: an initial charge controller unit controlling the switch and the first switching element to turn ON on a basis of a start instruction and controlling the switch and the first switching element to turn OFF on a basis of a stop instruction.

A twelfth aspect of the present invention is directed to a power source device. The power source device comprises: a first capacitor, a first switching element of a charge driven type, one main electrode thereof being connected to one end of the capacitor; a second capacitor, one end thereof being connected to the one main electrode of the first switching element, and other end thereof being connected to a control electrode of the first switching element; a DC power source, one end thereof being connected to other end of the first capacitor, and other end thereof being connected to other main electrode of the first switching element; and a switch interposed into a path of a current flowing in circular through the first capacitor, the first switching element and the DC power source.

A thirteenth aspect of the present invention is directed to a power conversion device. The power conversion device comprises: a first capacitor; a first switching element of a charge driven type, one main electrode thereof being connected to one end of the capacitor; a second capacitor, one end thereof being connected to the one main electrode of the first switching element, and other end thereof being connected to a control electrode of the first switching element; a fourth switching element, one main electrode thereof being connected to the one end of the first capacitor; a fifth switching element, one main electrode thereof being connected to other main electrode of the fourth switching element, and other main electrode thereof being connected to the other end of the first capacitor; a sixth switching element, one main electrode thereof being connected to the one end of the first capacitor; and a seventh switching element, one main electrode thereof being connected to other main electrode of the sixth switching element, and other main electrode thereof being connected to the other end of the first capacitor.

According to a fourteenth aspect of the present invention, in the power conversion device of the thirteenth aspect, the power conversion device further comprises: a controller unit controlling the fourth to seventh switching elements so as to perform a normal operation of the fourth to seventh switching elements.

According to a fifteenth aspect of the present invention, in the power conversion device of the fourteenth aspect, the power conversion device further comprises: a switch connected in series to the first capacitor and the first switching element, wherein the controller unit controls the switch and the first switching element to turn ON on a basis of a start instruction and controls the switch and the first switching element to turn OFF on a basis of a stop instruction.

In a device according to the first aspect of the present invention, the device is used by connecting a DC power source to the other end of the first capacitor and the other end of the first switching element and connecting any one of various loads supplied with a power to the one end and the other end of the first capacitor. A fluctuation in a source voltage supplied to the load is suppressed by the first capacitor, and an inrush current flowing through the first capacitor is limited by the first switching element and the second capacitor.

Further, since the first switching element gradually turns ON due to the second capacitor to thereby limit the inrush current, the power resistor through which a large current flows is removed contrary to the first and second prior arts, and it is possible to set a rated power high contrary to the third prior art. Accordingly, the overall weight and volume of the device can be reduced even under a high rated power. Moreover, since the power resistor is removed, when an external switch is turned ON to supply a source voltage, a high voltage is not applied to the switch. Therefore, the reliability and durability of the switch are not harmed.

In a device according to the second aspect of the present invention, since the first resistor is interposed between the first capacitor and the control electrode of the first switching element in addition to the second capacitor, the first switching element is prevented from oscillating and from prematurely turning ON immediately after the external switch turning ON to supply the source voltage. Further, an initial charging current, which flows through the first and second capacitors immediately after the external switch turning ON, is effectively limited by the first resistor.

In a device according to the third aspect of the present invention, since the first diode is connected in inverse-parallel to the first switching element, the first switching element is protected from a reverse current.

In a device according to the fourth aspect of the present invention, since the drive circuit driving the first switching element is provided, a small signal transmitted as a control signal can easily drive the first switching element having a high rated power.

In a device according to the fifth aspect of the present invention, since the drive current driving the first switching element to turn ON is limited by the first output resistor, the first switching element turns ON more gradually so as to limit the inrush current more effectively.

In a device according to the sixth aspect of the present invention, since the first output resistor is provided, the first switching element turns ON more gradually so as to limit the inrush current more effectively. Further, since the second switching element and the third switching element are connected in series and only one of them turns ON, a leak current can be suppressed, thereby reducing drive power consumption.

In a device according to the seventh aspect of the present invention, since the second output resistor is provided, the drive current driving the first switching element to turn OFF can be set at a proper value.

In a device according to the eighth aspect of the present invention, since the first output resistor is provided, the first switching element turns ON more gradually so as to limit the inrush current more effectively. Further, since the second and third switching elements are connected in series and only one of them turns ON, a leak current can be suppressed, thereby reducing drive power consumption. Moreover, since the second diode is provided, the turn-OFF of the first switching element can be speeded up without affecting the turn-ON thereof.

In a device according to the ninth aspect of the present invention, the first switching element can be turned ON further more gradually by the first output resistor and the second resistor, and thereby the inrush current can be limited more effectively. Further, since both drive-ON and drive-OFF of the first switching element are performed by single switching element, the overall weight and volume of the device can further be reduced. Moreover, since the second diode is provided, the turn-OFF of the first switching element can be speeded up without affecting the turn-ON thereof In a device according to the tenth aspect of the present invention, since the switch is provided, the supply of the source voltage can be started and stopped without preparing an external switch. Further, since the power resistor through which a large current flows is removed contrary to the first and second prior arts, a high voltage is not applied to the switch when the switch turns ON. Therefore, the reliability and durability of the switch are improved.

In a device according to the eleventh aspect of the present invention, since the initial charge controller unit is provided, the switch and the first switching element automatically operates only by giving the start and stop instructions.

In a device according to the twelfth aspect of the present invention, since the device according to the first aspect of the present invention is provided as an inrush current limiting circuit, such a power source device is implemented as to limit the inrush current with high reliability and durability, reducing the overall weight and volume of the device and coping with a high rated power.

In a device according to the thirteenth aspect of the present invention, since the device according to the first aspect of the present invention is provided as an inrush current limiting circuit, such a power conversion device is implemented as to limit the inrush current with high reliability and durability, reducing the overall weight and volume of the device and coping with a high rated power.

In a device according to the fourteenth aspect of the present invention, since the controller unit is provided, signals controlling the fourth to seventh switching elements are not needed to be input from the exterior to perform the normal operation.

In a device according to the fifteenth aspect of the present invention, since the controller unit controls the switch and the first switching element on the basis of the start and stop instructions, the device can easily be handled.

These and other objects, features, aspects and advantages of the present invention will become more apparent from the following detailed description of the present invention when taken in conjunction with the accompanying drawings.

BRIEF DESCRIPTION OF DRAWINGS

FIGS. 7 and 8 are graphs showing simulation results on the power conversion device of FIG. 1.

FIG. 13 is a circuit diagram showing a structure of a power conversion device according to a sixth preferred embodiment of the present invention.

BEST MODE FOR CARRYING OUT THE INVENTION

1. First Preferred Embodiment

First, a power conversion device according to the first preferred embodiment of the present invention will be described.

1.1. Outline of Device Structure

Figure 1:
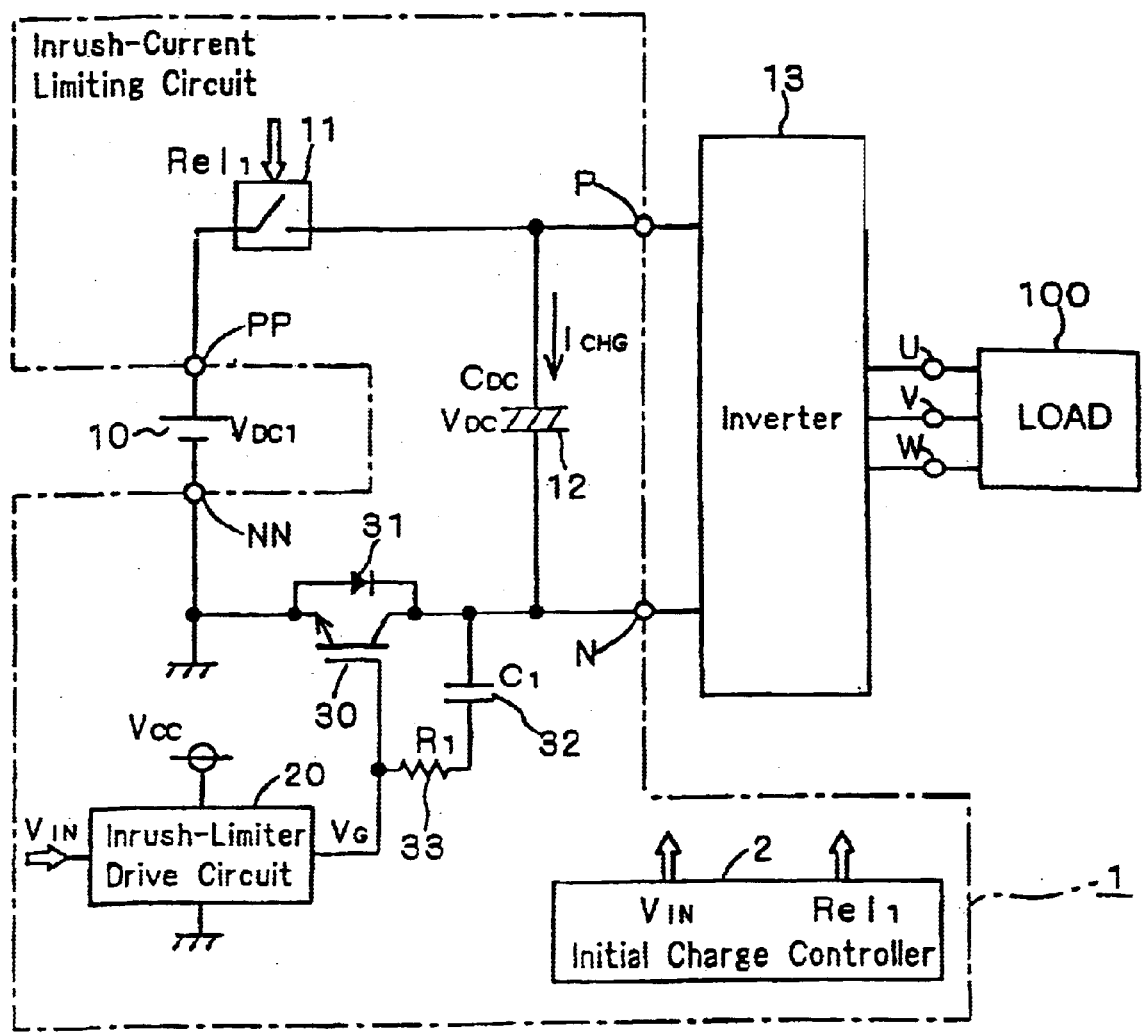
FIG. 1 is a circuit diagram showing a structure of a power conversion device according to a first preferred embodiment of the present invention.
Figure 16:
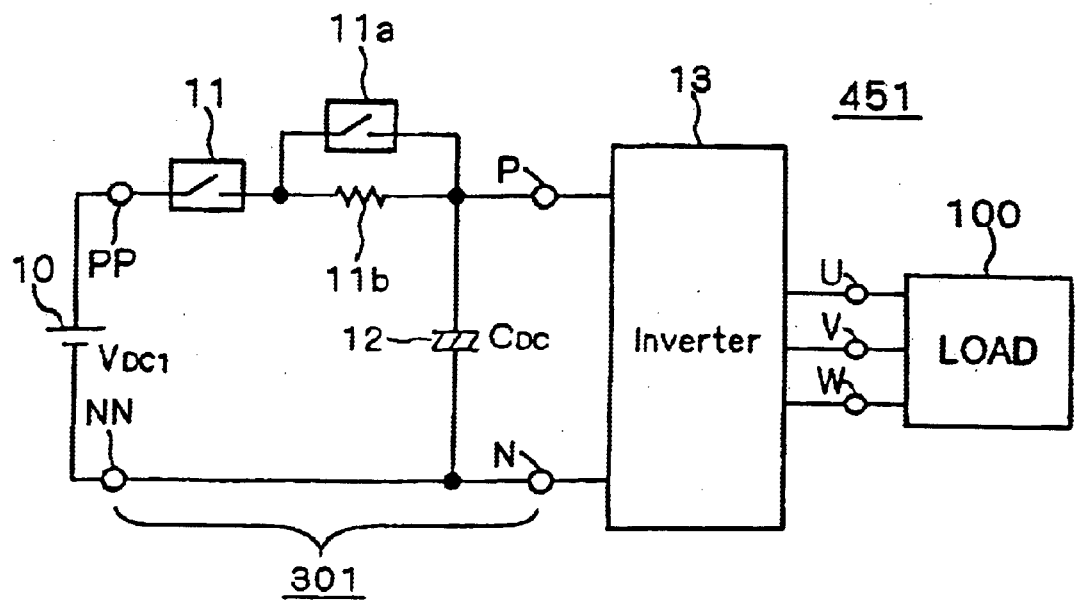
FIG. 16 is a circuit diagram showing a structure of a power conversion device according to the first prior art.
Figure 17:
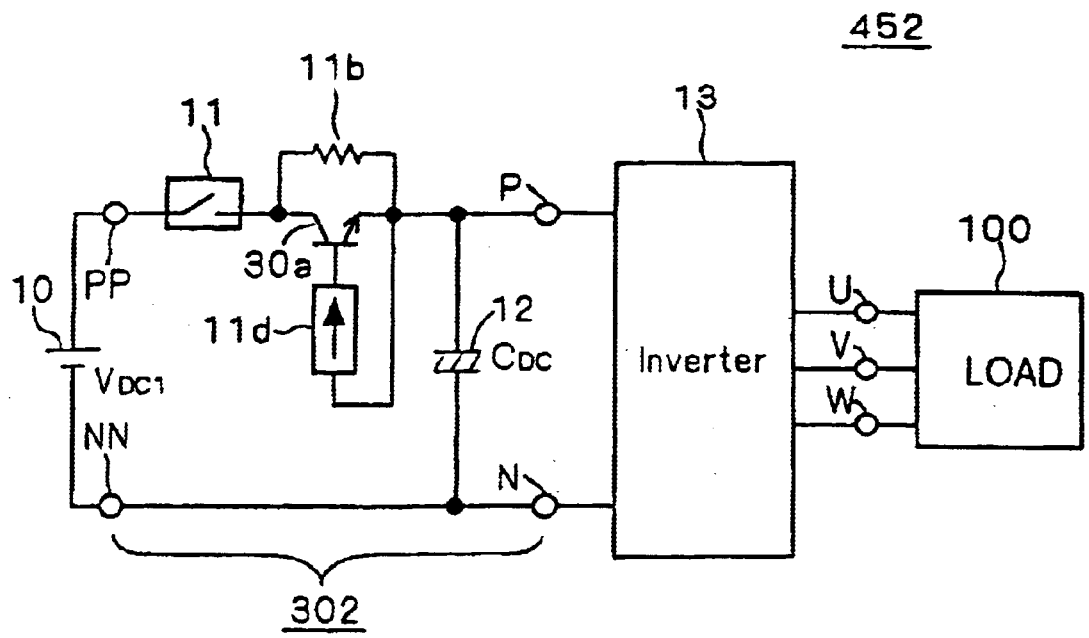
FIG. 17 is a circuit diagram showing a structure of a power conversion device according to the second prior art.
Figure 18:
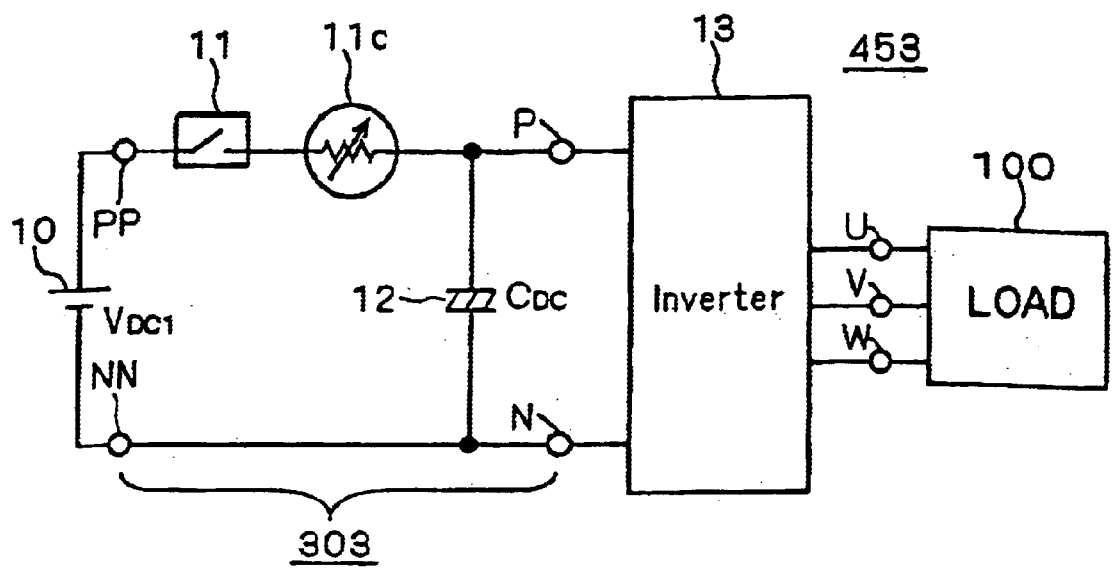
FIG. 18 is a circuit diagram showing a structure of a power conversion device according to the third prior art.

FIG. 1 is a circuit diagram showing a structure of a power conversion device according to the first preferred embodiment of the present invention. In the following figures, the same reference characters are allotted to the same parts or the corresponding parts (i.e. parts having the same functions) as those in the conventional devices shown in FIGS. 16 to 18 so as to make clear the relationship therebetween.

The power conversion device 401 shown in FIG. 1 comprises a main power source 10, an inrush current limiting circuit 1 and an inverter 13. The main power source 10 is connected to input terminals PP and NN of the inrush current limiting circuit 1, and the inverter 13 is connected to output terminals P and N. The power conversion device 401 is utilized by connecting a three-phase load 100, such as a motor, to output terminals U, V and W of the inverter 13.

The inrush current limiting circuit 1 comprises a switch 11, a capacitor 12, a switching element 30, a diode 31, a capacitor 32, a resistor 33, a drive circuit 20 and an initial charge controller unit 2. The main power source 10 supplies the input terminals PP and NN with a DC source voltage $V_{DC1}$. The capacitor 12 so functions as to hold the source voltage $V_{DC1}$ at a constant level by means of its capacitance $C_{DC}$. The switch 11, structured as a relay, functions as a main switch that turns ON when starting the inverter 13 and turns OFF when stopping it.

The switching element 30 is of a charge driven type, and will be supposed to be an IGBT as an example in the following description except for in the fifth preferred embodiment. In this case, a pair of main electrodes of the switching element 30 are a collector and an emitter, and a control electrode thereof is a gate. The collector of the switching element 30 is connected to one end of the capacitor 12, and the emitter is connected to the input terminal NN.

Thus, the switch 11, the capacitor 12 and the switching element 30 are connected in series to one another. A serial circuit formed thereof is connected to the input terminals PP and NN at its one and the other ends, respectively. Generally, an order of the capacitor 12 and the switching element 30 placed in the serial circuit is unlimited. The output terminals P and N are connected to one and the other ends of the capacitor 12, respectively.

The capacitor 32 having a capacitance $C_1$ and the resistor 33 having a resistance $R_1$ are connected in series to each other. A serial circuit formed of the capacitor 32 and the resistor 33 is connected to the collector and the gate of the switching element 30 at its one and the other ends, respectively. The switching element 30, thereby, so functions to limit an inrush current flowing through the capacitor 12 immediately after the switch 11 turns ON. The operation of the switching element 30 will be described in detail later.

The diode 31 is connected in parallel to the switching element 30 in such a direction that a forward current flows through the diode 31 and the switching element 30 in circular. In the present specification, it is referred to as "connected in inverse-parallel" that a diode is connected to a switching element in such a direction that the forward current flows in circular. The diode 31 protects the switching element 30 from the reverse current.

The drive circuit 20, which is connected to the gate of the switching element 30, transmits a gate voltage $V_G$ to the gate in response to a control signal $V_{IN}$ to thereby drive the switching element 30. The drive circuit 20 is configured as shown in a circuit diagram of FIG. 2, for example. The drive circuit 20 shown in FIG. 2 comprises switching elements 21 and 24, and output resistors 22 and 23.

Each of the switching elements 21 and 24 is formed as a MOSFET (though bipolar transistors can equally be used), a pair of main electrodes thereof are a drain and a source, and a control electrode thereof is a gate. The switching element 21, which is a P-type MOSFET is connected to a higher potential source line 25 at its source. The resistor 22 is connected to the drain of the switching element 21 at its one end and to the gate of the switching element 30 at its other end through a signal line 27.

The switching element 24, which is an N-type MOSFET is connected to the input terminal NN at its source through a lower potential source line and to the gate of the switching element 21 at its gate. The control signal $V_{IN}$ is input to the gates of the two switching elements 21 and 24 through a signal line 26. The resistor 23 is connected to the drain of the switching element 24 at its one end and to the gate of the switching element 30 at its other end through the signal line 27.

The two switching elements 21 and 24 exclusively turn ON on the basis of the control signal $V_{IN}$. The switching element 21 turns ON to thereby output a drive current that ON-drives the switching element 30 (i.e. drives the switching element 30 to turn ON). A resistance $R_{GON}$ of the output resistor 22 functions as an output resistance while the switching element 30 being ON-driven. The switching element 24 turns ON to thereby sink a drive current that OFF-drives the switching element 30 (i.e. drives the switching element 30 to turn OFF). A resistance $R_{GOFF}$ of the output resistor 23 functions as an output resistance while the switching element 30 being OFF-driven.

The resistance $R_{GOFF}$ is set at a few Ω or less in order to speed up the turn-OFF of the switching element 30 and to prevent any possible faulty turn-ON of the switching element 30.

On the other hand, the resistance $R_{GON}$ is set at higher values in order to slow down the turn-ON of the switching element 30 and thereby limit the inrush current flowing through the capacitor 12.

Referring again to FIG. 1, the initial charge controller unit 2 transmits a control signal $Rel_1$ to the switch 11 and transmits the control signal $V_{IN}$ to the drive circuit 20 to thereby control the switch 11 and the switching element 30. The initial charge controller unit 2 controls the switch 11 and the switching element 30 to turn ON on receiving a start instruction from outside. The initial charge controller unit 2 also controls the switch 11 and the switching element 30 to turn OFF on receiving a stop instruction from outside. The start and stop instructions are input by an operator operating a switch, which is not shown, for example.

A combination of the main power source 10 and the inrush current limiting circuit 1 forms a power source device having an inrush current limiting function.

1.2. Operation of Device

Now, description will be given on the operation of the power conversion device 401. Principles of the characteristic operation to limit the inrush current flowing through the capacitor 12 immediately after the switch 11 turns ON can be explained by considering the turn-ON process of the switching element 30.

The switching element 30 is of a charge driven type, i.e. a voltage controlled type. The switching element 30, therefore, is controlled by charging (when turning ON) and discharging (when turning OFF) its equivalent input capacitance.

Figure 3:
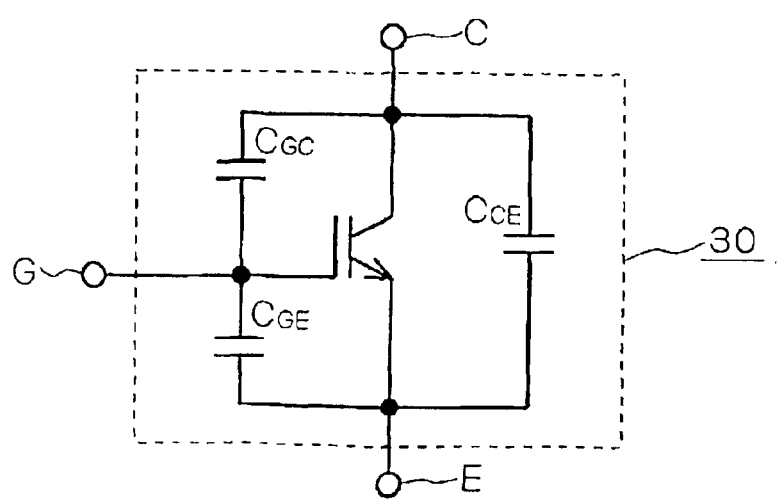
FIG. 3 is an equivalent circuit diagram of the switching element 30.

FIG. 3 is a circuit diagram showing the simplified equivalent circuit of the switching element 30. Although FIG. 3 shows an example of the switching element 30 being an IGBT, the same principle applies also to a MOSFET. The switching element 30 equivalently includes, a gate-emitter capacitance $C_{GE}$, a gate-collector capacitance (also referred to as a reverse transfer capacitance or a Miller capacitance) $C_{GC}$, and a collector-emitter capacitance $C_{CE}$.

Figure 4:
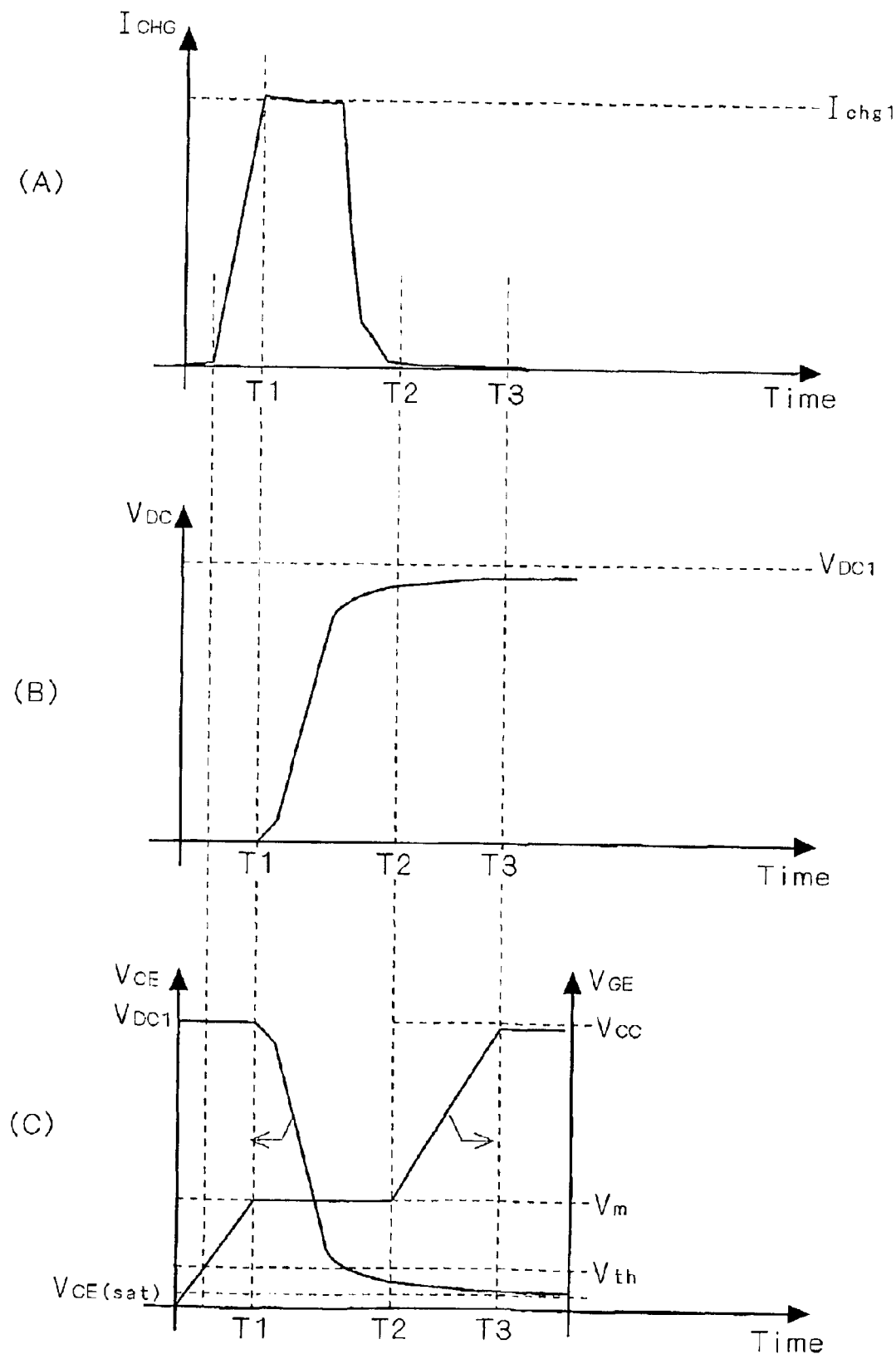
FIG. 4 is a timing chart showing an operation of a device compared with the power conversion device of FIG. 1.

FIG. 4 is a timing chart showing change in voltages and currents at various portion in the current limiting circuit 1 while the switching element 30 is turning ON without the capacitor 32 and the resistor 33 connected. In order to fully turn ON the switching element 30, its input capacitance which consists of the gate-emitter capacitance $C_{GE}$ and the gate-collector capacitance $C_{GC}$ must be charged by the drive circuit 20.

When the switching element 21 turns ON and the switching element 24 turns OFF in order to turn ON the switching element 30 (at time=0), the gate emitter capacitance $C_{GE}$ starts to be charged by the drive current flowing through the resistance $R_{GON}$. As the gate-emitter voltage $V_{GE}$ reaches the threshold voltage $V_{th}$ following the gate emitter capacitance $C_{GE}$ being charged, the collector current (equal to a charging current $I_{CHG}$ flowing through the capacitor 12) starts to flow through the switching element 30. However, the collector-emitter voltage $V_{CE}$ remains at its high OFF-state value (i.e. the source voltage $V_{DC1}$ of the main power source 10).

Charging of the gate-emitter capacitance $C_{GE}$ continues steadily until a time T1 when charging of the gate-collector capacitance $C_{GC}$ starts and the gate-emitter voltage $V_{GE}$ stops increasing. The collector current $I_{CHG}$ also increases following the increase in the gate-emitter voltage $V_{GE}$ until it reaches its maximum value $I_{chg1}$ at the time T1.

After the time T1, the collector-emitter voltage $V_{CE}$ starts to drop rapidly requiring more charging current to be supplied to the gate-collector capacitance $C_{GC}$ (which is referred to as Miller effect) and that is why the gate-emitter voltage $V_{GE}$ remains almost constant around the voltage Vm (i.e. Miller voltage) during the interval T1–T2. As the change in the collector-emitter voltage $V_{CE}$ slows down, the gate-emitter voltage $V_{GE}$ starts to increase again until it reaches its maximum value (i.e. the source voltage $V_{CC}$ of the drive circuit 20) at a time T3, and the collector emitter voltage $V_{CE}$ reaches its lowest ON-state value (i.e. the collector-emitter saturation voltage $V_{CE(sat)}$).

Since the switching element 30 is connected in series between the main power source 10 and the capacitor 12 as FIG. 1 shows, we note that the charged voltage $V_{DC}$ across the capacitor 12 ((B) of FIG. 4) will be a reverse image of the collector-emitter voltage $V_{CE}$ ((C) of FIG. 4). Thus, the change rate (i.e. $dV_{DC}/dt$) of the charged voltage $V_{DC}$ across the capacitor 12 is defined by the turn-ON process of the switching element 30 during the period T1–T2.

Figure 5:
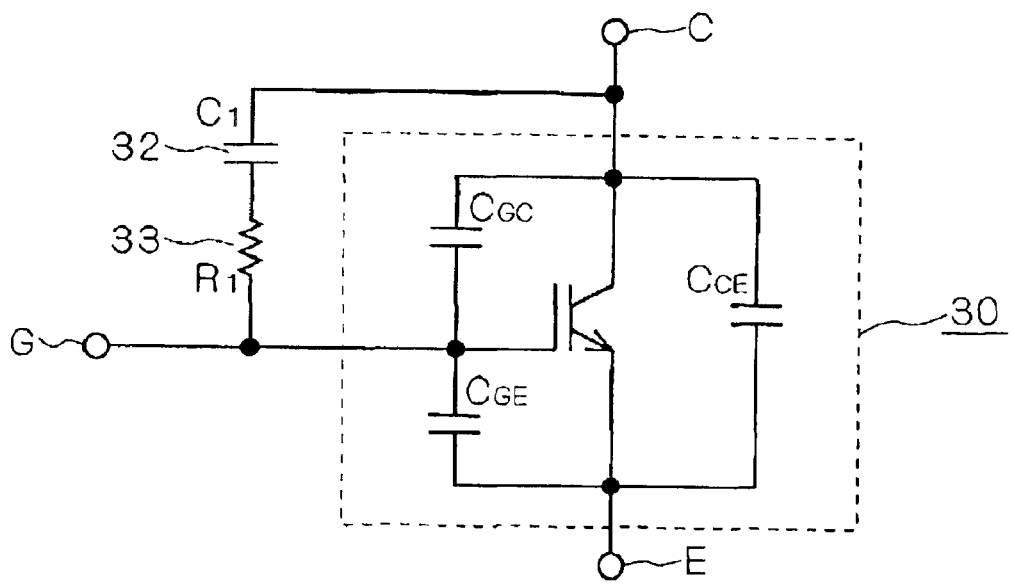
FIG. 5 is an equivalent circuit diagram of the switching element 30.

Since the change rate of the charged voltage $V_{DC}$ determines the charging current $I_{CHG}$ (i.e. the inrush current) flowing from the main power source 10 through the capacitor 12 as part (A) of FIG. 4 shows, we can control the charging current $I_{CHG}$ by controlling the turn-ON process of the switching element 30 during the period T1–T2. Thus, the inrush-current can be reduced by reducing the change rate of the charged voltage $V_{DC}$ across the capacitor 12 during the period T1–T2, or equivalently, by increasing the length of the period T1–T2. This can be achieved by adding the capacitor 32 outside the switching element 30 as a circuit diagram of FIG. 5 shows. The capacitance $C_1$ of the capacitor 32 functions as an additional gate-collector capacitance.

Figure 6:
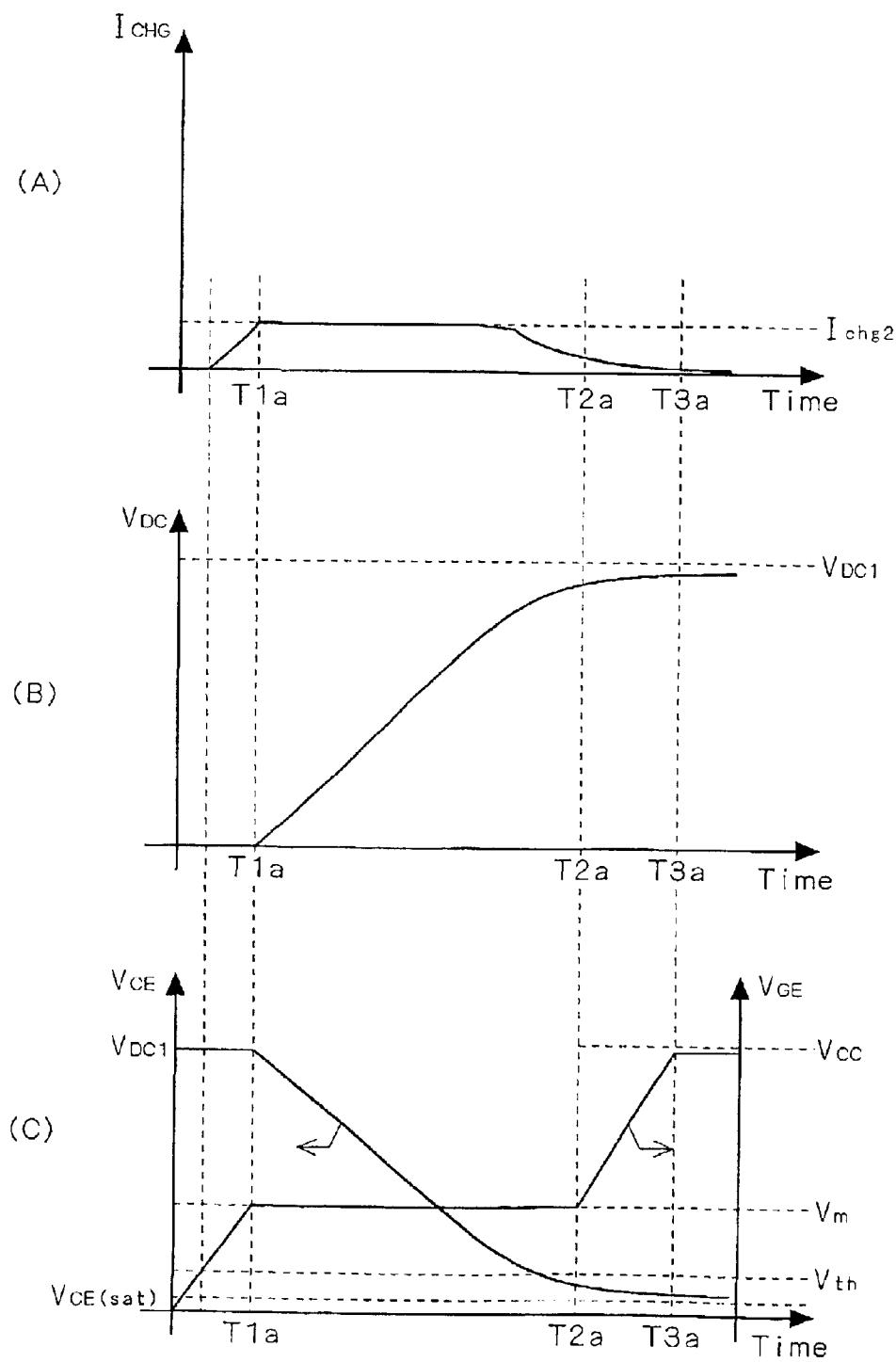
FIG. 6 is a timing chart showing an operation of the power conversion device of FIG. 1.

FIG. 6 is a timing chart showing change in voltages and currents at various portion in the current limiting circuit 1 while the switching element 30 is turning ON with the capacitor 32 and the resistor 33 connected as FIG. 5 shows. We note the reduced change rate of the charged voltage $V_{DC}$ during the period T1a–T2a because of the extra time needed to charge the external capacitor 32. Also, we note the resulting decrease in the inrush current (i.e. the charging current $I_{CHG}$) flowing through the capacitor 12.

Flow of the operation of the power conversion device 401 can now be followed. Initially the switch 11 is kept OFF and also the switching element 30 is kept OFF by switching OFF the switching element 21 and switching ON the switching element 24. When, the initial charge controller unit 2 controls the switch 11 to turn ON, an initial charging current will start to flow from the main power supply 10 through the switch 11, the capacitor 12, the capacitor 32, the resistor 33, the resistor 23, and the switching element 24. This initial charging current will be limited mainly by the resistor 33 because the resistance $R_{GOFF}$ of the resistor 23 is selected to have a small value (few Ω) or less as mentioned above.

Then, the initial charge controller unit 2 transmits the control signal $V_{IN}$ to the drive circuit 20 so as to turn ON the switching element 30. As a result, the operation shown in FIG. 6 is performed. After the capacitor 12 is sufficiently charged and thereby the charged voltage $V_{DC}$ reaches the source voltage $V_{DC1}$, the inverter 13 starts the normal operation. When the inverter 13 is stopped, the initial charge controller unit 2 turns OFF the switch 11 and the switching element 30.

1.3. Corroborating Data

Figure 2:
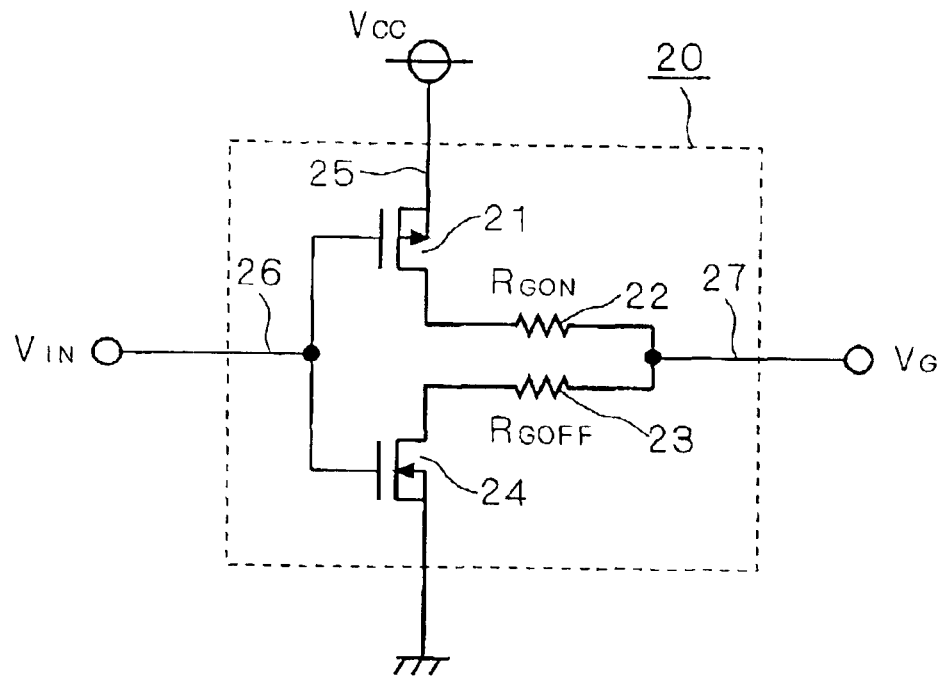
FIG. 2 is a circuit diagram showing a structure of the drive circuit of FIG. 1.

Now, the computer simulation conducted in order to prove the performance of the power conversion device 401 will be described. In the power conversion device 401 prepared for the simulation, the drive circuit 20 is configured as FIG. 2 shows. The circuit parameters used in the simulation are as follows:

$V_{DC1}$=300 V; $V_{cc}$=15 V; $R_{GON}$=10 k Ω; $R_{OFF}$=1 Ω; $R_1$=100 Ω; $C_1$=10 nF and 100 nF (two cases); $C_{DC}$=1.2 mF; ESR=1 m Ω (effective series resistance of capacitor 12); ESL=20 nH (effective series inductance of capacitor 12); switching element 30=IGBT (rated current=300 A and rated voltage=600 V).

Figure 7:
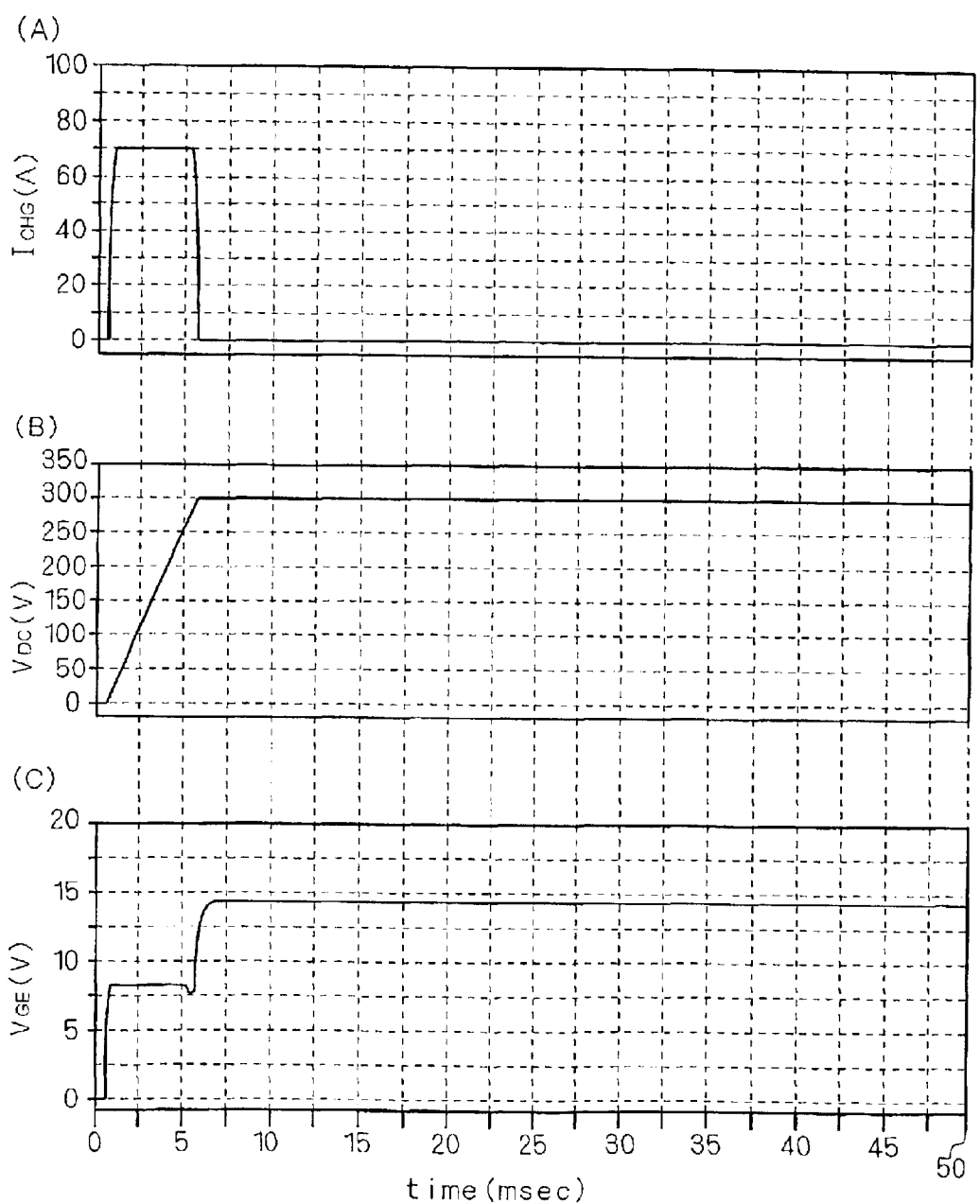

FIG. 7 is a graph showing the result of the simulation where $C_1$=10 nF. FIG. 8 is a graph showing the result of the simulation where $C_1$=100 nF. After the control signal $V_{IN}$ is transmitted to the drive circuit 20 to turn ON the switching element 30 (at time=0), the charged voltage $V_{DC}$ reaches the source voltage $V_{DC1}$ in about 5 msec when $C_1$=10 nF, whereas in about 38 msec when $C_1$=100 nF. In consistent with this, the maximum value of the charging current $I_{CHG}$ is about 70 A when $C_1$=10 nF, whereas it is suppressed to as low as 10 A when $C_1$=100 nF.

Thus, the effect of increasing the capacitance $C_1$ of the capacitor 12 on reducing the inrush current is clearly evident from these simulation results. Namely, the simulation results have proven the successful operation of the power conversion device 401.

1.4. Advantages of Device

As stated above, in the power conversion device 401, the inrush current flowing through the capacitor 12 is limited by the switching element 30 and the capacitor 32. Further, since the switching element 30 gradually turns ON due to the capacitor 32 to thereby limit the inrush current, the power resistor 11b through which a large current flows is removed contrary to the first and second prior arts, and it is possible to set a rated power high contrary to the third prior art. Accordingly, the overall weight and volume of the device can be reduced even under a high rated power. Moreover, since the power resistor 11b is removed, a high voltage is not applied to the switch 11 when the switch 11 turns ON. Therefore, the reliability and durability of the switch 11 are improved.

Furthermore, since the resistor 33 is connected in series to the capacitor 12, the switching element 30 is prevented from oscillating at its gate, and from prematurely turning ON immediately after the switch 11 turns ON. In addition, an initial charging current, which flows through the capacitors 12 and 32 immediately after the switch 11 turns ON, is effectively limited by the resistor 33.

Moreover, since the drive current ON-driving the switching element 30 is limited by the resistance $R_{GON}$ of the output resistor 22, the switching element 30 turns ON more gradually so as to limit the inrush current more effectively. Further, since the switching elements 21 and 24 are connected in series and turn ON exclusively with each other, a leak current can be suppressed, and thereby drive power consumption can be reduced.

2. Second Preferred Embodiment

Figure 9:
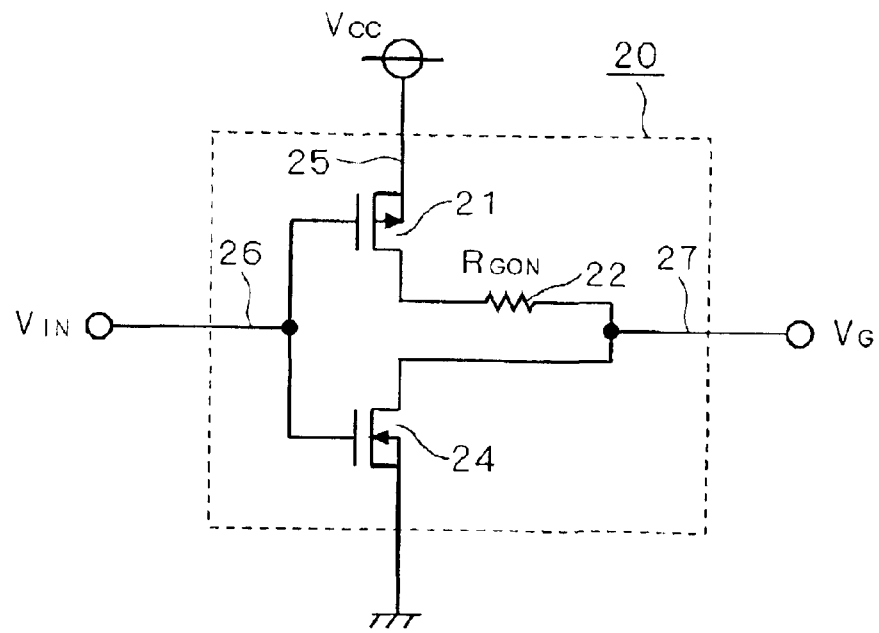
FIG. 9 is a circuit diagram showing a structure of a drive circuit according to a second preferred embodiment of the present invention.

FIG. 9 is a circuit diagram showing a structure of the drive circuit 20 according to the second preferred embodiment of the present invention. This drive circuit 20 is characteristically different from the drive circuit 20 according to the first preferred embodiment in that the drain of the switching element 24 and the gate of the switching element 30 are connected to each other through the signal line 27 without a resistor interposed. Since the resistor 23 is removed from the drive circuit 20 according to the first preferred embodiment, the device configuration is advantageously simplified. Further, the current OFF-driving the switching element 30 is not limited by the resistor 23, and therefore, the turn-OFF of the switching element 30 is speeded up.

3. Third Preferred Embodiment

Figure 10:
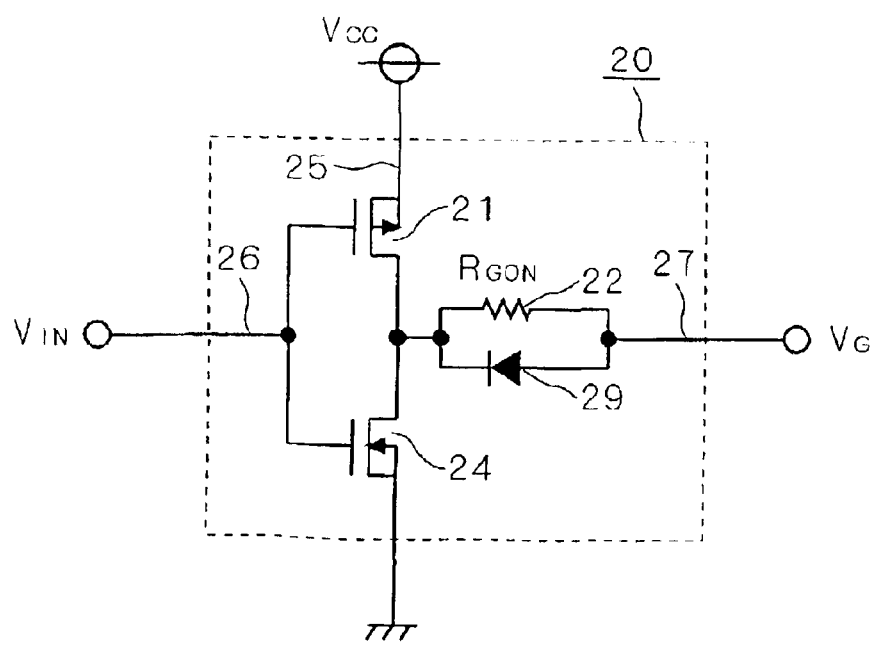
FIG. 10 is a circuit diagram showing a structure of a drive circuit according to a third preferred embodiment of the present invention.

FIG. 10 is a circuit diagram showing a structure of the drive circuit 20 according to the third preferred embodiment of the present invention. This drive circuit 20 is characteristically different from the drive circuit 20 according to the first preferred embodiment in that the drain of the switching element 21 and the drain of the switching element 24 are connected to each other, and a parallel circuit formed of the resistor 22 and a diode 29 connected in parallel is interposed between a connection of the two switching elements 21, 24 and the gate of the switching element 30. The diode 29 is placed in such a direction that its forward current functions as the drive current OFF-driving the switching element 30.

In the drive circuit 20, the drive current ON-driving the switching element 30 is limited by the output resistor 22 without intervention of the diode 29 as well as in the drive circuit 20 shown in FIG. 2. The drive current OFF-driving the switching element 30, on the other hand, flows through the diode 29. Accordingly, the turn-OFF of the switching element 30 is speeded up similarly to that in the drive circuit 20 shown in FIG. 9.

4. Fourth Preferred Embodiment

Figure 11:
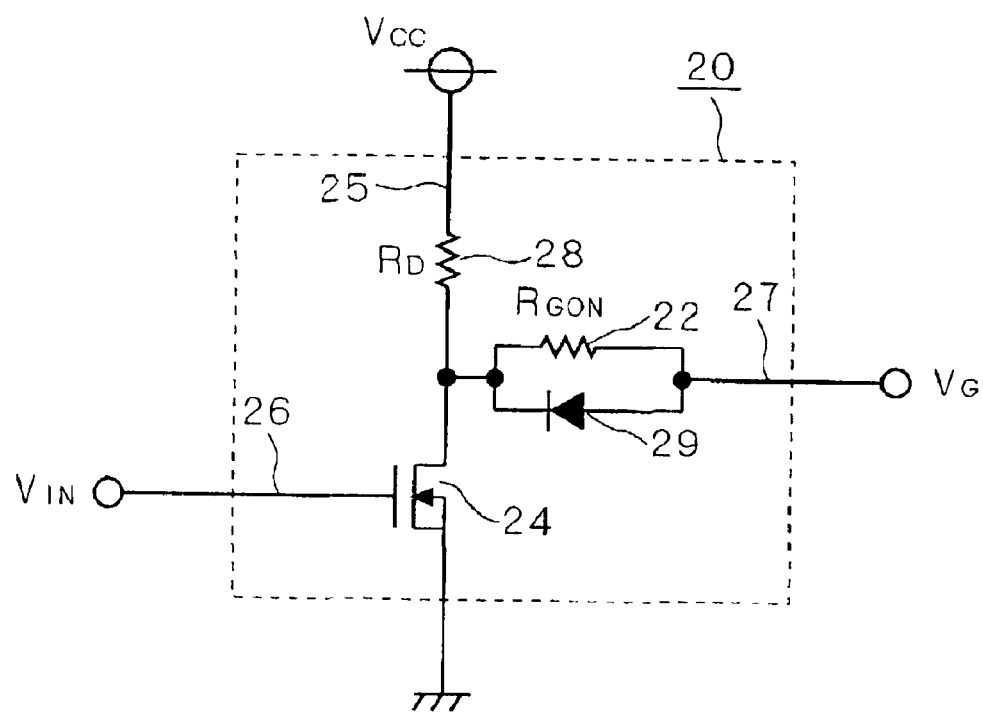
FIG. 11 is a circuit diagram showing a structure of a drive circuit according to a fourth preferred embodiment of the present invention.

FIG. 11 is a circuit diagram showing a structure of the drive circuit 20 according to the fourth preferred embodiment of the present invention. This drive circuit 20 is characteristically different from the drive circuit 20 according to the third preferred embodiment in that the switching element 21 is replaced with a resistor 28. The drive current ON-driving the switching element 30 is limited by the total resistance of the resistance $R_{GON}$ of the output resistor 22 and the resistance $R_D$ of the resistor 28 without the intervention of the diode 29. The drive current OFF-driving the switching element 30 flows through the diode 29. The turn-OFF of the switching element 30, therefore, is speeded up similarly to that in the drive circuit 20 shown in FIG. 10. Further, since the switching element 21 is replaced with the resistor 28, the device configuration is simplified. In contrast, the drive circuits 20 shown in FIGS. 2, 9 and 10 have advantage in that the leak current flowing from the higher potential source line 25 to the lower potential source line is suppressed, and thereby drive power consumption can be reduced.

5. Fifth Preferred Embodiment

Figure 12:
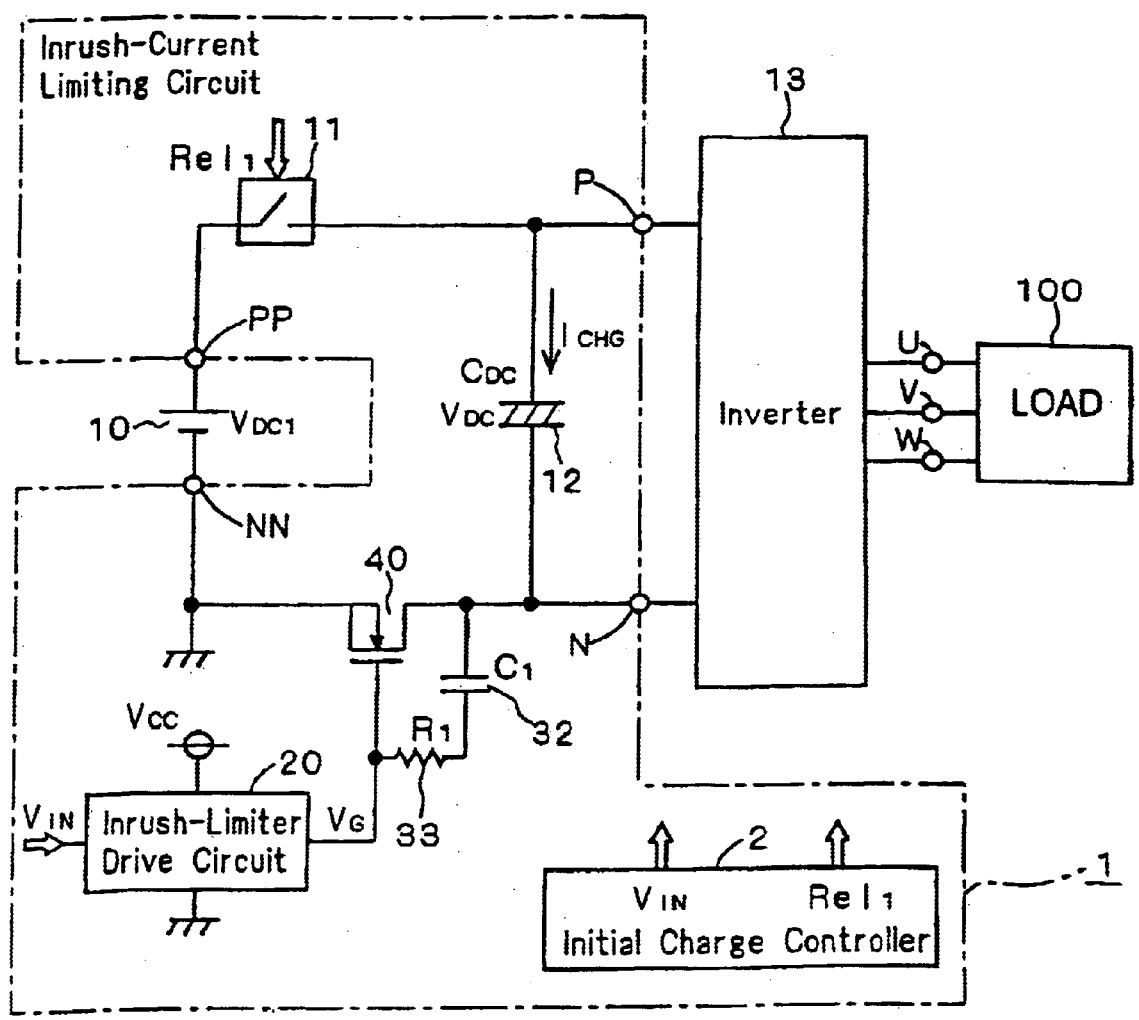
FIG. 12 is a circuit diagram showing a structure of a power conversion device according to a fifth preferred embodiment of the present invention.

FIG. 12 is a circuit diagram showing a structure of a power conversion device according to the fifth preferred embodiment of the present invention. This power conversion device 402 is characteristically different from the power conversion device 401 according to the first preferred embodiment in that a MOSFET 40 is used for the switching element 30. A switching element of a charge driven type can generally be used for the switching element 30. The IGBT in the power conversion device 401 and the MOSFET in the power conversion device 402 are widely used, and those having various ratings are advantageously available.

6. Sixth Preferred Embodiment

FIG. 13 is a circuit diagram showing a structure of a power conversion device according to the sixth preferred embodiment of the present invention. This power conversion device 403 is characteristically different from the power conversion device 401 according to the first preferred embodiment in that the switching element 30 and the diode 31 are interposed into a higher potential source line connecting the input terminal PP and the output terminal P. As stated in the first preferred embodiment, it is generally satisfactory that the switch 11, the switching element 30 and the capacitor 12 are connected in series to one another, and the output terminals PP and NN are connected to one and the other ends of the capacitor 12, respectively. FIG. 13 shows other example of the general configuration than that of FIG. 1.

7. Seventh Preferred Embodiment

Figure 14:
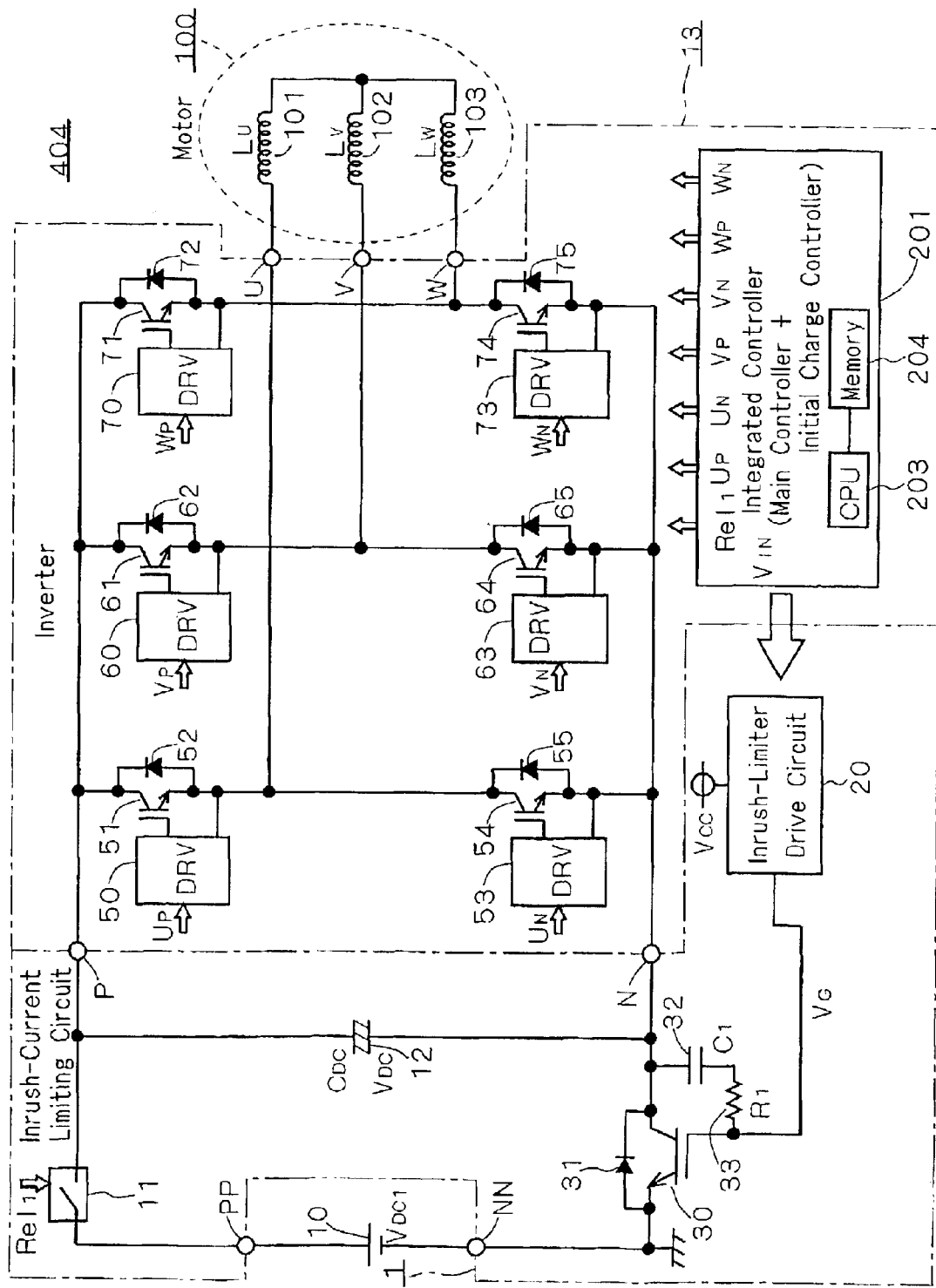
FIG. 14 is a circuit diagram showing a structure of a power conversion device according to a seventh preferred embodiment of the present invention.

FIG. 14 is a circuit diagram showing a structure of a power conversion device according to the seventh preferred embodiment of the present invention. This power conversion device 404 is characteristically different from the power conversion device 401 according to the first preferred embodiment in that the inverter 13 comprises an integrated controller unit 201. The integrated controller unit 201 functions simultaneously both as a main controller unit that controls a group of the switching elements 51, 54, 61, 64, 71 and 74 provided in the inverter 13 to perform the normal operation and as the initial charge controller unit 2, which controls the switch 11 and the switching element 30 provided in the inrush current limiting circuit 1.

The integrated controller unit 201 comprises a CPU 203 and a memory 204. The CPU 203 operates on the basis of a program stored in the memory 204 to thereby implement the normal operation of the group of the switching elements 51, 54, 61, 64, 71 and 74, and to control the switch 11 and the switching element 30.

Generally, each of the switching elements 51, 54, 61, 64, 71 and 74 is a semiconductor element that controls a main current flowing across the same through a pair of main electrodes in response to a signal input to a control electrode. Preferably, the same is a power switching element e.g. a power IGBT, a power bipolar transistor, and a power MOSFET. Above all, the power IGBT advantageously has low saturation voltage $V_{CE(sat)}$ which is defined as a voltage between the pair of the main electrodes in a conducting (ON) state, and is of voltage control type, which can easily be controlled. Therefore, each of the switching elements 51, 54, 61, 64, 71 and 74 will be supposed to be a power IGBT in the following description.

Collectors of the switching elements 51, 61 and 71 are connected to the output terminal P of the inrush current limiting circuit 1. Collectors of the switching elements 54, 64 and 74 are connected to emitters of the switching elements 51, 61 and 71, respectively, and emitters are connected to the output terminal N of the inrush current limiting circuit 1. The output terminal U of the inverter 13 is connected to a connection between the switching elements 51 and 54. The output terminal V is connected to a connection between the switching elements 61 and 64. The output terminals W is connected to a connection between the switching elements 71 and 74.

The inverter 13 further comprises freewheeling diodes 52, 55, 62, 65, 72 and 75, and drive circuits 50, 53, 60, 63, 70 and 73. The freewheeling diodes 52, 55, 62, 65, 72 and 75 are respectively connected in inverse-parallel to the switching elements 51, 54, 61, 64, 71 and 74.

The freewheeling diodes 52, 55, 62, 65, 72 and 75 are provided in order to protect the switching elements 51, 54, 61, 64, 71 and 74 from reverse currents, respectively.

The drive circuits 50, 53, 60, 63, 70 and 73 are connected to gates of the switching elements 51, 54, 61, 64, 71 and 74, respectively. The drive circuits 50, 53, 60, 63, 70 and 73 respectively drive the switching elements 51, 54, 61, 64, 71 and 74 in response to control signals $U_P$, $U_N$, $V_P$, $V_N$, $W_P$ and $W_N$, respectively.

The integrated controller unit 201 can also be divided into the main controller unit that outputs the control signals $U_P$, $U_N$, $V_P$, $V_N$, $W_P$ and $W_N$ to thereby perform the normal operation of the switching elements 51, 54, 61, 64, 71 and 74 and the initial charge controller unit 2, which controls the switch 11 and the switching element 30. In this configuration, the initial charge controller unit 2 can be structured to receive the start and stop instructions from the main controller unit. However, the configuration shown in FIG. 14, where the main controller unit and the initial charge controller unit 2 are integrated into the single integrated controller unit 201 advantageously enables the overall weight and volume and the manufacturing cost of the device to be reduced.

8. Eighth Preferred Embodiment

Figure 15:
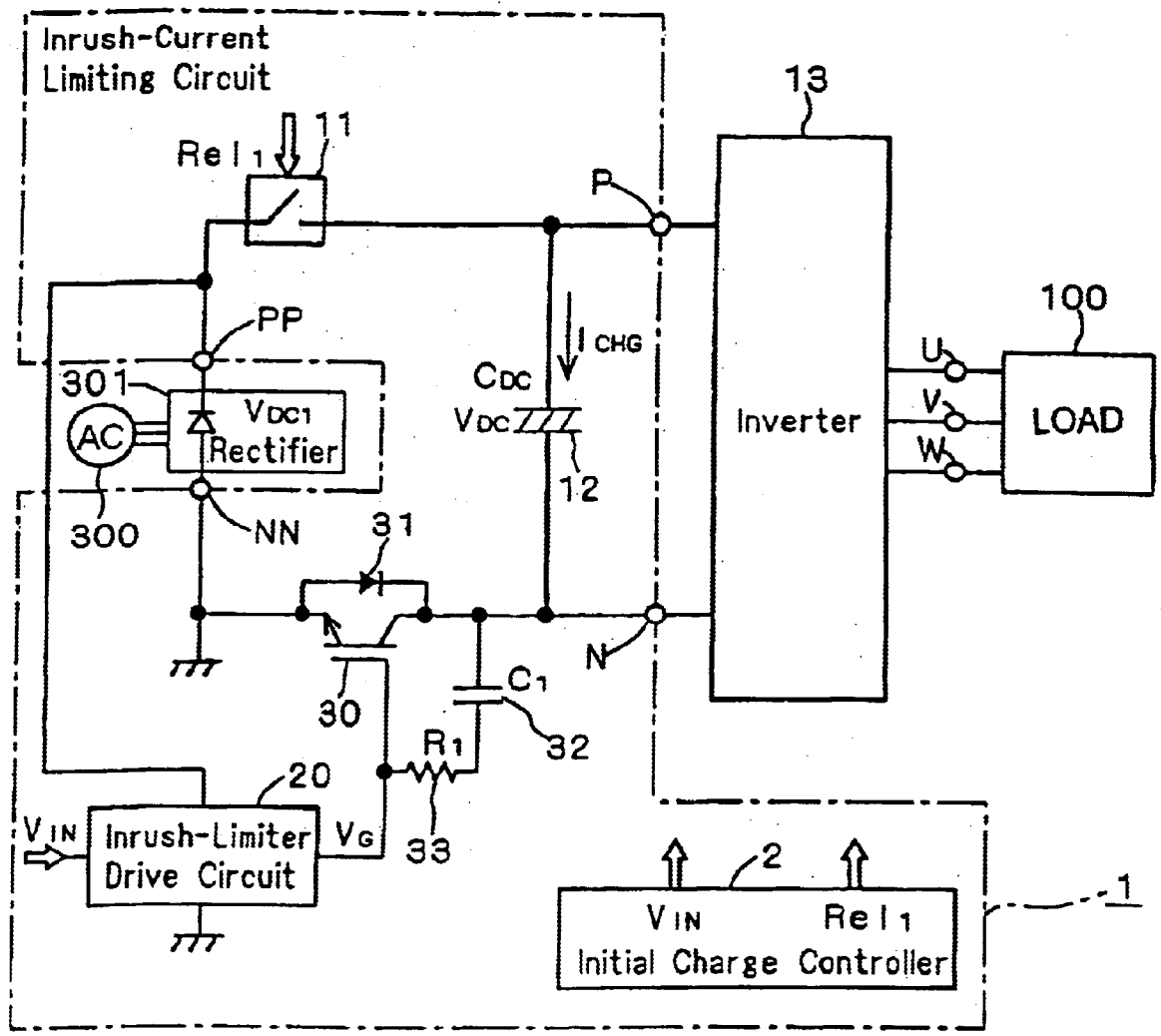
FIG. 15 is a circuit diagram showing a structure of a power conversion device according to an eighth preferred embodiment of the present invention.

FIG. 15 is a circuit diagram showing a structure of a power conversion device according to the eighth preferred embodiment of the present invention. This power conversion device 405 is characteristically different from the power conversion device 401 according to the first preferred embodiment in that it comprises a rectifier circuit 301 converting an AC voltage input from an external AC power source 300 into the DC source voltage $V_{DC1}$. The rectifier circuit 301 applies the source voltage $V_{DC1}$ between the input terminals PP and NN. Accordingly, the power conversion device 405 can be used only by connecting an available AC power source 300 without preparing an external DC power source.

While the invention has been shown and described in detail, the foregoing description is in all aspects illustrative and not restrictive. It is therefore understood that numerous modifications and variations can be devised without departing from the scope of the invention.

What is claimed is:

1. An inrush current limiting circuit, comprising:
   a first capacitor;
   a first switching element of a charge driven type, one main electrode thereof being connected to one end of said first capacitor; and
   a second capacitor, one end thereof being directly connected to said one main electrode of said first switching element, and another end thereof being connected to a control electrode of said switching element.

2. The inrush current limiting circuit according to claim 1, further comprising:
   a first resistor interposed between said one main electrode and said control electrode of said first switching element and connected in series to said second capacitor.

3. The inrush current limiting circuit according to claim 1, further comprising:
   a first diode connected in inverse-parallel to said first switching element.

4. The inrush current limiting circuit according to claim 1, further comprising:
   a drive circuit configured to drive said first switching element in response to a control signal and connected to said control electrode of said first switching element.

5. The inrush current limiting circuit according to claim 4, wherein
   said drive circuit comprises a first output resistor interposed into a path of a drive current which drives said first switching element to turn ON.

6. The inrush current limiting circuit according to claim 4, wherein
   said drive circuit comprises:
      a second switching element, one main electrode thereof being connected to a source line;
      a first output resistor, one end thereof being connected to other main electrode of said second switching element, and other end thereof being connected to said control electrode of said first switching element; and
      a third switching element, one main electrode thereof being connected to said control electrode of said first switching element, and a control electrode thereof being connected to a control electrode of said second switching element.

7. The inrush current limiting circuit according to claim 6, wherein said drive circuit further comprises a second output resistor interposed between said control electrode of said first switching element and said one main electrode of said third switching element.

8. The inrush current limiting circuit according to claim 4, wherein said drive circuit comprises:

a second switching element, one main electrode thereof being connected to a source line;

a third switching element, one main electrode thereof being connected to another main electrode of said second switching element, another main electrode thereof being connected to another main electrode of said first switching element, and a control electrode thereof being connected to a control electrode of said second switching element;

a first output resistor, one end thereof being connected to a connection between said second switching element and said third switching element, and another end thereof being connected to said control electrode of said first switching element; and a second diode connected in parallel to said first output resistor so that a forward current thereof drives said first switching element to turn OFF.

9. The inrush current limiting circuit according to claim 4, wherein said drive circuit comprises:

a second resistor, one end thereof being connected to a source line;

a first output resistor, one end thereof being connected to another end of said second resistor, another end thereof being connected to said control electrode of said first switching element;

a third switching element, one main electrode thereof being connected to said another end of said second resistor, another main electrode thereof being connected to another main electrode of said first switching element; and a second diode connected in parallel to said first output resistor so that a forward current thereof drives said first switching element to turn OFF.

10. The inrush current limiting circuit according to claim 1, further comprising:

a switch connected in series to said first capacitor and said first switching element.

11. The inrush current limiting circuit according to claim 10, further comprising:

an initial charge controller unit configured to control said switch and said first switching element to turn ON on a basis of a start instruction and to control said switch and said first switching element to turn OFF on a basis of a stop instruction.

12. A power source device, comprising:

a first capacitor;

a first switching element of a charge driven type, one main electrode thereof being connected to one end of said capacitor;

a second capacitor, one end thereof being directly connected to said one main electrode of said first switching element, and another end thereof being connected to a control electrode of said first switching element;

a DC power source, one end thereof being connected to another end of said first capacitor, and another end thereof being connected to another main electrode of said first switching element; and a switch interposed into a path of a current flowing circularly through said first capacitor, said first switching element and said DC power source.

13. A power conversion device, comprising:

a first capacitor;

a first switching element of a charge driven type, one main electrode thereof being connected to one end of said first capacitor;

a second capacitor, one end thereof being directly connected to said one main electrode of said first switching element, and another end thereof being connected to a control electrode of said first switching element;

a fourth switching element, one main electrode thereof being connected to said one end of said first capacitor;

a fifth switching element, one main electrode thereof being connected to another main electrode of said fourth switching element, and another main electrode thereof being connected to said another end of said first capacitor;

a sixth switching element, one main electrode thereof being connected to said one end of said first capacitor; and a seventh switching element, one main electrode thereof being connected to another main electrode of said sixth switching element, and another main electrode thereof being connected to said another end of said first capacitor.

14. The power conversion device according to claim 13, further comprising:

a controller unit configured to control said fourth to seventh switching elements so as to perform a normal operation of said fourth to seventh switching elements.

15. The power conversion device according to claim 14, further comprising:

a switch connected in series to said first capacitor and said first switching element, wherein said controller unit controls said switch and said first switching element to turn ON on a basis of a start instruction and controls said switch and said first switching element to turn OFF on a basis of a stop instruction.

* * * * *